United States Patent [19]

Chapman et al.

[11] Patent Number: 4,842,675
[45] Date of Patent: Jun. 27, 1989

[54] INTEGRATED CIRCUIT ISOLATION PROCESS

[75] Inventors: Richard A. Chapman, Dallas; Clarence W. Teng, Plano, both of Tex.

[73] Assignee: Texas Instruments Incorporated, Dallas, Tex.

[21] Appl. No.: 882,732

[22] Filed: Jul. 7, 1986

[51] Int. Cl.⁴ .................. H01L 21/306; B44C 1/22; C03C 15/00; C03C 25/06

[52] U.S. Cl. .................. 156/643; 148/DIG. 50; 156/648; 156/653; 156/657; 156/659.1; 156/661.1; 156/662; 357/49; 437/62; 437/228

[58] Field of Search ............... 156/643, 648, 651, 653, 156/657, 659.1, 661.1, 662; 252/79.1; 437/61, 62, 67, 72, 228, 233, 238, 241; 357/23.1, 23.11, 49; 148/DIG. 50, 33.3; 428/156

[56] References Cited

U.S. PATENT DOCUMENTS

| | | | |
|---|---|---|---|
| 4,222,792 | 9/1980 | Lever et al. | 437/67 |
| 4,551,911 | 11/1985 | Sasaki et al. | 156/648 X |
| 4,571,819 | 2/1986 | Rogers et al. | 437/62 |
| 4,604,162 | 8/1986 | Sobczak | 437/62 X |
| 4,740,480 | 4/1988 | Ooka | 437/67 |

*Primary Examiner*—William A. Powell
*Attorney, Agent, or Firm*—Rodney M. Anderson; Leo N. Heiting; Melvin Sharp

[57] ABSTRACT

A multiple recess isolation technology avoids stress induced defects while providing a substantially planar surface. A silicon substrate (10) is patterned and etched, creating active moat regions (18) and recesses (20a–b and 21a–b). The recesses are filled with oxide by growing a field oxide (40) in wide recessed regions (21) using a LOCOS process, while depositing a planarization field oxide (44) in narrow recessed regions (20). After etching the structure to obtain a planar surface, standard procedures are used to fabricate the active devices. The process uses a single photolithographic masking step and results in only a very small loss of the width electrically active regions.

32 Claims, 2 Drawing Sheets

INTEGRATED CIRCUIT ISOLATION PROCESS

TECHNICAL FIELD OF THE INVENTION

This invention pertains in general to integrated circuits, and more particularly relates to isolation technology for application to VLSI circuits with submicron dimensions.

BACKGROUND OF THE INVENTION

In integrated circuit technology, it is necessary to separate the active regions of active devices (the "moat regions") from one another. In LSI and VLSI integrated circuits using MOS technology, isolation of active regions is usually accomplished by LOCOS (Local Oxidation of Silicon). To perform LOCOS, a patterned nitride on top of a thin oxide stack is used to cover the areas of a silicon substrate which will be the moat regions. By exposing the uncovered regions of the silicon substrate to a high temperature oxidizing ambient, a relatively thick field oxide is grown only in the exposed regions.

However, the LOCOS technique grows field oxide not only vertically in the exposed silicon regions, but also laterally underneath the edges of the nitride mask. This lateral oxide encroachment under the nitride, known as "birds-beak," can grow to a thickness of about half the field oxide thickness; thus, substantial real estate is wasted in this isolation technology. With the standard LOCOS process, the field oxide thickness has to be scaled down appropriately in order to reduce the birds-beak, otherwise, the remaining moat region will be inadequate for active device fabrication. The reduction in field oxide thickness, however, degrades the circuit performance because of increased interconnect capacitance. In addition, the leakage current under the field oxide and between adjacent moat regions increases rapidly with decreasing oxide thickness for a given voltage applied to a conductor passing over the field oxide, resulting in poor isolation between adjacent moats.

Several isolation techniques have been developed for reducing the amount of oxide encroachment in the standard LOCOS process. An isolation technology known as SWAMI (Sidewall Masked Isolation) uses a silicon etch and sidewall nitride layer (a layer of silicon nitride formed on the sides of the recessed silicon region) to suppress the lateral encroachment of the field oxide. The key aspect for the near-zero encroachment is the presence of the sidewall nitride, which is lifted up during growth of the field oxide. While the SWAMI process reduces encroachment of the field oxide, it too has limitations. One limitation is the tendency of the oxidation mask (deposited after the sidewall nitride layer) to fail at the butt joint between the first nitride layer and the sidewall nitride layer. This failure occurs mainly due to the normal over-etching during the sidewall process and is evidenced by the localized encroachment of the field oxide, particularly at the corners of the patterns. Another limitation of the conventional SWAMI process is its increased sensitivity to defect generation in the silicon substrate due to the presence of the sidewall nitride. Another limitation is the double threshold that occurs in transistor characteristics due to a region adjacent to a moat having a relatively thin oxide, but which does not contain sufficient channel stop impurity.

A modification of the SWAMI process, modified fully-framed-fully-recessed (MF$^3$R) isolation, reduces the limitations of SWAMI. After the nitride, oxide, and recessed silicon layers are patterned and etched, the process uses an "undercut and backfill" technique, in which the oxide layer is undercut laterally for about 200-1000 Angstroms by wet-etching. A second pad oxide and a subsequent conformable deposition of a sidewall nitride refills the undercut cavity, forming an increased joint area between the two nitride films. This increased area maintains the integrity of the nitride-to-nitride joint during the oxide/nitride/oxide sidewall etch and subsequent field oxidation. A major limitation of the MF$^3$R process is that the silicon can be recess-etched only to depths of about 2,000 Angstroms. This may result in inadequate isolation between active regions.

Another approach to device isolation is the buried oxide (BOX) process. In the BOX process, a stress relief oxide layer is grown, followed by a chemical vapor deposit (CVD) of silicon nitride. The nitride/oxide stack is then patterned and etched using standard lithographic techniques, as in the SWAMI process. The etch is followed by deposition of a thicker oxide layer. Although the CVD oxide layer fills up the recessed-etch silicon regions, the layer is not planarized since the oxide sinks into wide recessed-etched regions, creating depressions in the CVD oxide layer. In order to form a planarized surface, a second photoresist pattern is used to fill the depressions with photoresist material and a third photoresist is used to coat the entire surface, resulting in a fairly planarized surface. A photoresist/oxide etch is used to etch-back both the photoresist and the oxide at the same rate thus leaving a fairly planarized oxide surface after any remaining photoresist is stripped off.

The BOX process has two major problems. The first problem is that the process requires two lithographic masking steps, which increases the complexity of the process. Secondly, the BOX process employs a critical resist etch-back process. In practice, the thickness of the spun-on resist depends upon pattern area density; the photoresist layer will be thinner in highly packed regions. As a result, the etched surface will be non-uniform after the resist etch-back and the surface of some active regions may be significantly attacked by the etch.

From the foregoing, it may be seen that a need has arisen for an isolation technology which provides substantially planar surfaces in high yield quantities, without substantial moat encroachment or stress induced defects near the active regions. Furthermore, a need has arisen for an isolation technology capable of providing a substantially planar surface, while using only one mask for patterning purposes. Such improved isolation technique should be able to provide planarized surfaces for both narrow and wide recesses between moats.

SUMMARY OF THE INVENTION

In accordance with the present invention, an isolation process is provided which substantially eliminates or prevents the disadvantages and problems associated with prior isolation processes.

In accordance with another aspect of the invention, a method is provided for isolating moats in a semiconductor substrate separated by narrow and wide recesses. A first field oxide is grown in the wide recesses. A second field oxide is then deposited over the substrate to fill the narrow recesses and any remaining unfilled portion of the wide recesses.

In accordance with yet another aspect of the invention, a method is provided for fabricating isolation regions for integrated circuits in a silicon substrate. Predetermined portions of the substrate are covered with a pad oxide layer and a first silicon nitride layer. Wide and narrow recesses are etched through the pad oxide and first nitride layer to the substrate to form moats adjacent to the recesses. A second silicon nitride layer is deposited over the substrate. The wide recesses are etched to clear a gap through the second silicon nitride layer substrate at the bottom of the wide recesses. A first field oxide is grown in the wide recess on the area of the substrate exposed by the gaps. A second field oxide layer is deposited to fill the narrow recess and the remainder of the wide recess. The second field oxide is then planarized to a level approximate to the top edge of the recess to form isolation regions between the moats.

BRIEF DESCRIPTION OF THE DRAWINGS

The present invention will be described with references to the accompanying Drawings, taken in conjunction with the following description wherein.

DETAILED DESCRIPTION OF THE INVENTION

The application of the preferred embodiment of the present invention is best understood by referring to FIGS. 1-8 of the Drawings, wherein like numerals are used for like and corresponding parts of the drawings.

Figure 1:
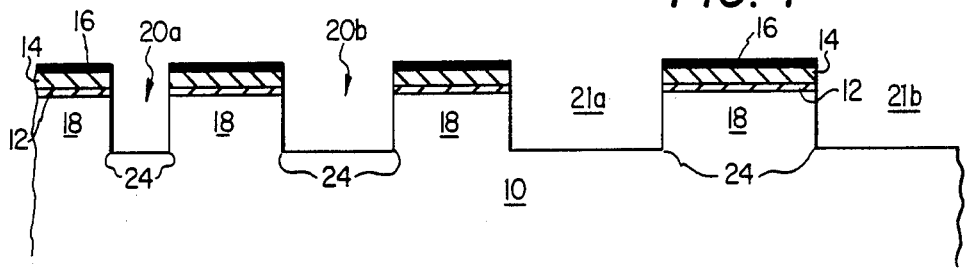
FIG. 1 shows a cross-section of a first stage of the invention, wherein a first nitride layer, with a first pad oxide layer underneath it, has been patterned with photoresist and exposed portions of the nitride, oxide, and silicon have been recess-etched.

Referring to FIG. 1, a monocrystalline silicon substrate 10 is illustrated which has undergone tank processing. High tank concentrations should be used to prevent short channel punchthrough of the active transistors. A first thermal oxide layer, the pad oxide 12, is grown on substrate 10 using a thermal process in which silicon dioxide is formed on the surface of the silicon substrate 10. The thickness of the oxide may vary from 200 to 500 Angstroms, with a preferred thickness of about 350 Angstroms. After the pad oxide 12 is grown, a first silicon nitride layer 14 is deposited upon the pad oxide 12 using a low pressure chemical vapor deposition (LPCVD) process. The thickness of the first silicon nitride layer 14 will typically range between 1,000 and 2,000 Angstroms, with a preferred thickness of about 1,800 Angstroms.

After deposition of the first silicon nitride layer 14, a photoresist pattern 16 is used to define the placement of the moat regions 18 (active regions), and to expose recessed regions 20a-b and 21a-b, where the field oxide will be grown in a later step. As will be noted, recessed regions 20a-b are relatively narrow, while recessed regions 21a-b are relatively wide, thus making it difficult to provide a planarized oxide surface with prior isolation processes. After the photoresist 16 has been deposited and patterned in the conventional manner, the first silicon nitride layer 14 and pad oxide layer 12 are etched according to the photoresist pattern. The etching chemistry preferably used is $CHF_3$-$C_2F_6$ chemistry, which provides a conveniently slow etching rate so that good operator control can be achieved. Naturally, other etches could be used to reach a similar result.

After etching the exposed areas of first nitride layer 14 and pad oxide layer 12, the silicon substrate 10 can be recessed-etched to form the moat regions 18, which will become the active regions of the eventual device. In the presently preferred embodiment, the silicon is etched to a depth of 3,000 to 7,500 Angstroms, with a preferred depth of about 5,000 Angstroms. The presently preferred embodiment for the silicon etching chemistry uses Freon 11, argon and nitrogen. However, a wide variety of silicon etches could be used as is well known to those skilled in the art. After the recess-etch, the photoresist 16 is removed, using well known photolithographic techniques.

Figure 2:
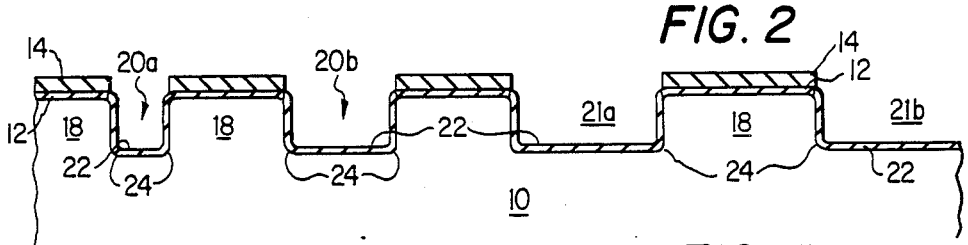
FIG. 2 shows a cross-section of a second stage of the invention, wherein a second thermal oxide layer has been grown and the photoresist layer has been removed.

FIG. 2 shows a cross-section of the semiconductor device after a second thermal oxide layer 22 is grown on the areas of the silicon substrate 10 which were exposed by the recess-etch and on the sides of the pad oxide 12, forming a continuous oxide covering over the silicon substrate 10. The second thermal oxide layer 22 serves several purposes, one of which is to slightly round off the corners 24 of the recessed regions in order to relieve the amount of stress at the corner 24. The thickness of the second thermal oxide layer 22 may typically vary from 250 to 1,000 Angstroms, and is preferably about 800 Angstroms in thickness. Since the second thermal oxide layer 22 is relatively thin, only a small loss of boron from the p-well to the growing thermal oxide will result.

It should be noted that the growth of the second thermal oxide layer 22 on the silicon substrate 10 consumes silicon, as silicon dioxide is formed. The consumption of silicon will decrease the width of the active moat regions 18. However, the amount of silicon consumed in the growth of silicon dioxide is only 45 percent of the thickness of the oxide grown. Thus, if a second thermal oxide layer 22 with a width of 800 Angstroms is grown, only 360 Angstroms of active width will be lost from each side of the moat region 18.

Figure 3:
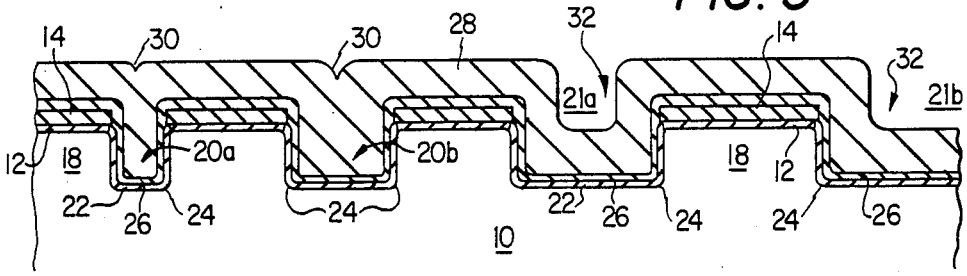
FIG. 3 shows a cross-section of a third stage in processing of the invention, after deposition of a second nitride layer and a thick sidewall oxide layer.

FIG. 3 shows a cross-section of the semiconductor device after the deposit of a second silicon nitride layer 26 and the deposit of the sidewall oxide layer 28 using a chemical vapor deposition (CVD) process. The second silicon nitride layer 26 has a thickness within the preferred range of 500 to 1,000 Angstroms, and is typically about 800 Angstroms thick. The sidewall oxide layer 28 has a thickness within a preferred range of 4,000 to 8,000 Angstroms, and is typically 5,000 Angstroms in thickness. It is important to note that the sidewall oxide layer 28 is of a much greater thickness than the previous oxide layers. The thickness of the sidewall oxide layer 28 is chosen to be thick enough to fill the narrow recessed regions 20a and 20b, while not filling the wide recessed regions 21a and 21b. Small depressions 30 will be formed over narrow recessed regions 20a and 20b where the sidewall oxide 28 fills the regions. In wide recessed regions 21a and 21b where the sidewall oxide on opposite sidewalls does not meet, deep depressions 32 will be left unfilled. The distance between the bottom of a deep depression 32 and the bottom of the corresponding wide recessed region 21a or b should be about equal to the thickness of the sidewall oxide layer 28.

Figure 4:
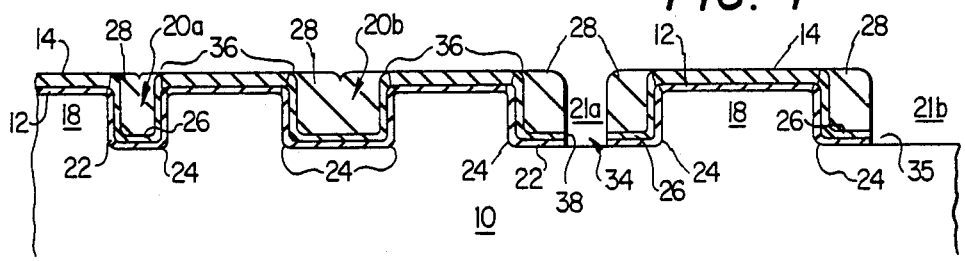
FIG. 4 shows a cross-section of a fourth stage in the processing of the invention, wherein the sidewall oxide has been etched.

FIG. 4 shows a cross-section of the semiconductor device after an anisotropic oxide/nitride etch has been used to vertically etch the sidewall oxide layer 28, the second silicon nitride layer 26 and the second thermal oxide layer 22. In the wide recessed regions 21a and 21b, all three layers are removed from under the deep depressions 32 by the etch, thereby exposing the silicon substrate 10 through gaps 34 and 35. Although it is not necessary to remove the second thermal oxide layer 22 as shown in FIG. 4, it will usually be removed in practice, since the sidewall etch cannot be controlled accurately enough to remove only the second silicon nitride layer 26. The anisotropic nature of this etch leaves a sidewall oxide layer 28 on the sidewalls of the wide recess regions 21a-b of width equal to 80 percent to 100 percent of the combined thickness of the etched layers 28, 26 and 22. The same etching gases as used for the first nitride layer 14 and pad oxide layer 12 may be used to effectuate the sidewall etch, namely, a mixture of $CHF_3$ and $C_2F_6$. Once again, other etches known to those skilled in the art may adequately replace the suggested etch.

The anisotropic etch also removes part of the top surface of the first silicon nitride layer 14, in order to ensure that all the nitride has been removed from the gap 34. Thus, the first silicon nitride layer 14 should be thick enough to leave approximately 1,000 Angstroms of nitride after the sidewall etch. It is important to prevent the etch from removing the nitride at the top corners 36 of the sidewall of the recessed regions 20a-b and 21a-b. The same techniques used in $MF^3R$ to prevent nitride removal can also be used in the present invention.

In performing the sidewall etch, the second silicon nitride layer 26 will not be removed from the narrow recessed regions 20a and b, nor will the etch remove the peripheral nitride layers 38 about the gaps 34 and 35. The thickness of the sidewall oxide layer 28 is chosen such that the narrow recessed regions 20a and b are completely covered by the sidewall oxide layer 28 after the sidewall etch.

Figure 5:
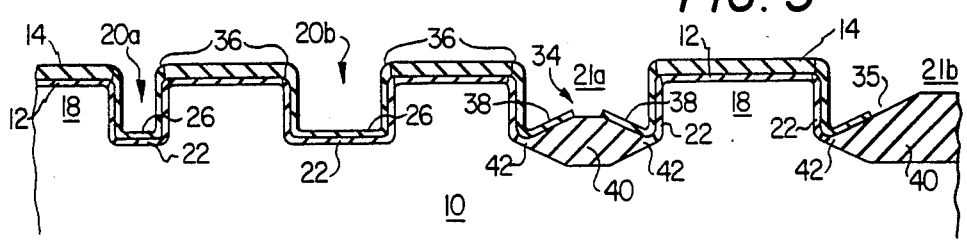
FIG. 5 shows a cross-section of a fifth stage in the processing of the invention, wherein the remaining sidewall oxide layer has been removed by a wet-etch process, after which a LOCOS field oxide has been grown in the gaps where the silicon has been exposed.

FIG. 5 shows a cross-section of the semiconductor device after the remaining sidewall oxide layer 28 has been wet-etched off the second silicon nitride layer 26 and a thick wide region thermal field oxide 40 is grown in the bottom of the wide recessed regions 21a-21b. The preferred etching chemistry uses a diluted HF solution; a 10% HF solution is preferred. The wet-etch will not effect the silicon nitride layers, 14 and 26, or the silicon exposed by the gaps 34 and 35. After the wet-etch, the wide region thermal field oxide 40 is grown in the gaps 34 and 35 using LOCOS (Local Oxidation of Silicon process). The thermal oxide will not grow on the silicon nitride layers, 14 and 26, thus the wide region thermal field oxide 40 is confined to the gaps 34 and 35. The thickness of the wide region thermal field oxide 40 is chosen such that the top surface of the wide region thermal field oxide 40 is approximately coplanar with the original top surface of the silicon substrate 10. The thickness may range from 6,000 to 15,000 Angstroms, and is typically about 10,000 Angstroms in thickness.

It should also be noted that in some situations, the wide recessed region 21a will have an intermediate width, such that only a small gap 34 is opened during the sidewall etch. In this case, as illustrated in FIG. 5, the thickness of the wide region thermal field oxide 40 will be less than the thickness obtained in wide recessed regions 21b having greater widths.

As seen in FIG. 5, the wide region thermal field oxide 40 grows underneath the edge of the peripheral nitride layers 38, resulting in "birds-beaks" 42. The thickness of the sidewall oxide layer 28 should be chosen in comparison to the thickness of the wide region thermal field oxide 40 to be grown, such that the birds-beak 42 do not grow up to the top edge of the moat regions 18 where they would decrease the active width of the moat regions 18.

Figure 6:
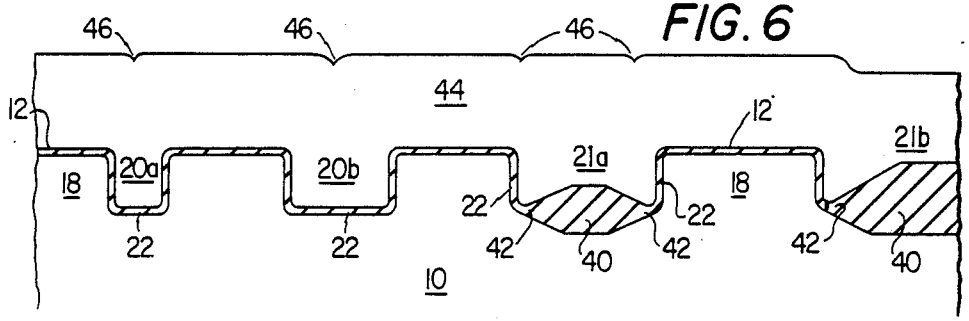
FIG. 6 shows a cross-section of a sixth stage in the processing of the invention, after the first and second silicon nitride layers have been removed and a thick planarization field oxide layer has been deposited.

FIG. 6 shows a cross-section of the semiconductor device after the nitride layers 14 and 26 have been removed, and a planarization field oxide layer 44 has been deposited on the surface. The nitride layers, 14 and 26, can be removed from the surface using hot phosphoric acid ($H_3PO_4$ at 160 degrees Centigrade) or another suitable chemical solution. The planarization field oxide layer 44 is deposited by a chemical vapor deposition (CVD) process in which the oxide thickness on the vertical walls grows at the same rate as on the horizontal surfaces. The oxide thickness is typically 10,000 Angstroms, but may range from 8,000-15,000 Angstroms. The thickness of the planarization field oxide layer 44 is chosen to be large enough so that the oxide on the sidewalls of the recessed regions 20a-b and 21a-b will grow together to fill up the recessed regions 20a-b and 21a-b.

Small depressions 46 may be left in the top surface of the planarization field oxide layer 44. If desired, a photoresist layer (not shown) can be added to the top of the planarization field oxide layer 44 to further planarize the surface.

Figure 7:
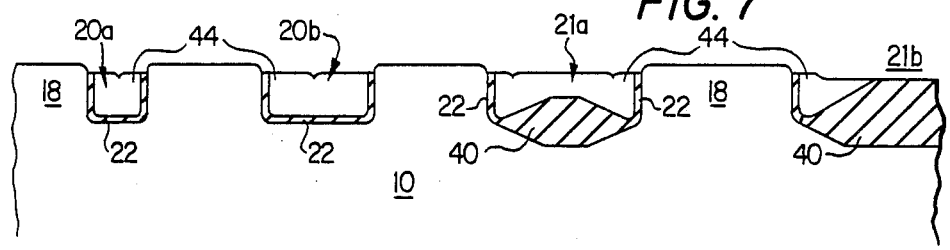
FIG. 7, shows a cross-section of a seventh stage in the processing of the invention, wherein a planarization plasma etch has been performed on the planarization field oxide, and the pad oxide has been removed.

FIG. 7 shows a cross-section of the semiconductor after a plasma etch has been used to etch away the planarization field oxide layer 44 and the thermal pad oxide 12 down the top of the moat regions 18. Once again, a mixture of $CHF_3$ and $C_2F_6$ can be used, or other suitable etchants may be substituted. To make sure that all of the pad oxide layer 12 has been removed, a very short wet or dry etch can be added at the end of this step. The structure is now ready for the formation of active devices, using technology well known in the art. As an example, formation of CMOS gates is illustrated below, although different steps would be used in conjunction with the present invention for other technologies, such as bipolar.

Figure 8:
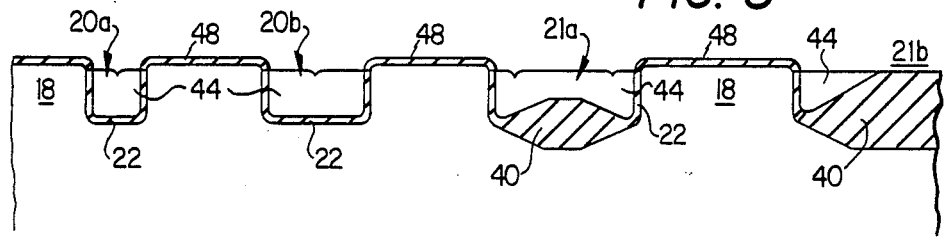
FIG. 8 shows a cross-section of a CMOS embodiment of the invention, wherein a gate oxide has been grown on the active regions of the structure.

FIG. 8 shows the cross-section of the semiconductor after a gate oxide 48 is grown over the moat regions 18 to form CMOS gates. The gate oxide 48 may vary in thickness from 50–250 Angstroms, with a typical thickness of 250 Angstroms. After the gate oxide 48 is grown, the processing proceeds to the deposition of the material (generally polysilicon) to be used to form the transistor gates. In an alternate embodiment of the invention, a pregate oxide (not shown), of thickness from 100–500 Angstroms, could be grown and then stripped prior to the growth of the gate oxide 48 in order to prevent the Kooi effect.

At this point, it is important to note that the top surface of the planaraziation field oxide layer 44 in the recessed regions 20a-b and 21a-b, is relatively flat and planarized. The planarization ensures that the gate material deposited in a subsequent step will not break at steps in the surface. Furthermore, the planar surface eliminates the occurrence of shorting filaments in that gate material which may be left after a highly anisotropic etch is used to define the gates.

Another important feature of the present invention is the minimization of the formation of stress related structural silicon defects at the sides of the recessed regions 20a-b or 21a-b. After the deposition of the planarization oxide field layer 44, the only high temperature heat treatments are the growth of the gate oxide 48 and subsequent annealing of the source/drain implants (not shown). Many defects would have been generated if the recessed regions 20a-b or 21a-b, had been completely filled by thermal oxidation.

It should also be noted that the addition of a field insulator channel stop to the sidewalls of the recessed regions, 20a-b and 21a-b, is unnecessary because of the high concentrations used in the tank processing. The high concentrations for n-well and p-well will provide adequate concentrations on the sidewalls of the recessed regions 20a-b or 21a-b, and will also prevent parasitic leakage parallel to the active transistor channel. Also, as mentioned in conjunction with FIG. 2, the loss of boron from the p-well to the growing second thermal oxide layer 22 will be small, due to the small thickness of the second thermal oxide layer 22. However, after the recess etch, a boron channel-stop implantation may be performed on the bottom and along the sidewalls of the recessed regions, 20a-b and 21a-b, if it is necessary to raise the thick field threshhold voltage.

Figure 9:
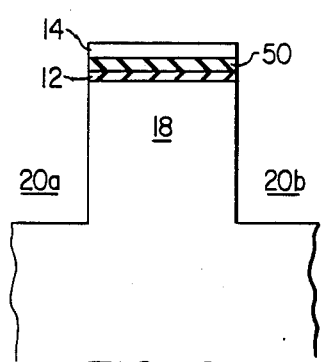
FIG. 9 shows another embodiment of the invention corresponding to FIG. 1, wherein a polysilicon layer is disposed between the pad oxide layer and the first silicon nitride layer.

FIG. 9 shows an alternate embodiment of the invention, wherein an optional polysilicon layer 50 is deposited between the pad oxide layer 12 and the first silicon nitride layer 14 in order to protect the silicon substrate 10 during the planarization etch. Using an etch selective to polysilicon, i.e., an etch with a very low etch rate for polysilicon, the planarization etch will stop on the optional polysilicon layer 50 and will not eat into the silicon substrate 10.

Figure 10:
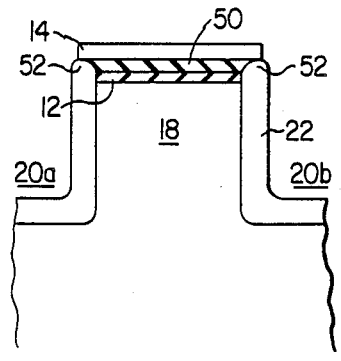
FIG. 10 shows the structure of FIG. 9, after growth of the second thermal oxide layer.

The additional polysilicon layer 50 may be necessary if the planarization etch cannot be controlled with adequate accuracy. If a polysilicon layer 50 is used, it should be noted that, as shown in FIG. 10, the growth of the second thermal oxide layer 22, as described relative to FIG. 2, will consume the side of the polysilicon layer 50 as well as the sidewall of the recessed region, 20a-b and 21a-b. Since the polysilicon layer 50 is undoped, and the silicon substrate 10 is relatively heavily doped, oxidation conditions can be chosen so that the polysilicon layer 50 etches at a slower rate than the silicon substrate 10. This will create an extended polysilicon roof 52 over the edge of the top of the silicon moat regions 18 and thereby protect it from the planarization etch. Since the growth of the second thermal oxide layer 22 will also consume part of the extended part of the extended polysilicon roof 52, the thickness of the optional polysilicon layer 50 should be chosen to leave sufficient polysilicon at the edge of this layer after growing the second thermal oxide layer 22 in order to prevent fracturing of the polysilicon layer 50 at the edges of the extended polysilicon roof 52.

Thus, the present invention provides advantages as discussed above, as well as numerous other advantages. As will be apparent to those skilled in the art, the present invention can be widely modified and varied. The scope of the invention is not limited, except as set forth in the accompanying claims.

What is claimed is:

1. A method for isolating regions in a semiconductor substrate separated by narrow and wide recesses comprising:
    growing a first field oxide only in the wide recesses, and
    depositing a second field oxide over the substrate to fill the narrow recesses and any remaining unfilled portion of the wide recesses.

2. The method of claim 1 wherein the substrate is covered with a pad oxide layer and a silicon nitride layer and then etched to provide gaps to the bottom of the wide recesses prior to growing of said first field oxide.

3. The method of claim 1 wherein the substrate is covered with a pad oxide layer, a polysilicon layer and a silicon nitride layer, and further comprising:
    etching said layers to provide gaps to the substrate in the wide recesses prior to growing said first field oxide.

4. The method of claim 2 wherein said etch is anisotropic.

5. The method of claim 3 wherein said etch is anisotropic.

6. A method for fabricating isolation regions for integrated circuits in a silicon substrate comprising:
    covering a predetermined portion of said substrate with a first oxide layer;
    covering said first oxide layer with a first silicon nitride layer;
    etching wide and narrow recesses through said first oxide and first nitride layers to said substrate to form moats adjacent said recesses;
    depositing a second silicon nitride layer over said substrate;
    etching said wide recesses to clear a gap through said second nitride layer at the bottom of said wide recesses;
    growing a first field oxide in said wide recesses on the area exposed by said gap;
    depositing a second field oxide layer to fill said narrow recess and the remainder of said wide recess; and
    planarizing said second field oxide layer to a level approximate to the top edge of said recesses to form isolation regions between said moats.

7. The method of claim 6 and further comprising:
forming a polysilicon layer between said first oxide layer and said first silicon nitride layer.

8. The method of claim 6 and further comprising:
growing a second oxide layer to cover the sidewalls of said recesses prior to depositing said second nitride layer.

9. The method of claim 6 and further comprising:
depositing a second oxide layer over said second silicon nitride layer such that said narrow recesses are filled, and said wide recesses are at least partially filled.

10. The method of claim 9 wherein the remainder of said second oxide layer is removed prior to growing said first field oxide in said wide recesses.

11. The method of claim 6 and further comprising:
removing said first and second silicon nitride layers prior to depositing said second field oxide layer.

12. The method of claim 6 wherein said recesses are etched to a depth of about 5,000 Angstroms.

13. The method of claim 6 wherein said second field oxide layer has a thickness of about 10,000 Angstroms.

14. The method of claim 6 wherein said first field oxide layer has a thickness of about 10,000 Angstroms.

15. A method of fabricating isolation regions for integrated circuits in a monocrystalline silicon substrate comprising:
covering a predetermined portion of said substrate with a pad oxide layer;
forming a first silicon nitride layer over said pad oxide layer;
etching wide and narrow recesses through said pad oxide and first nitride layers to said substrate to form moats adjacent said recesses;
growing a first sidewall oxide layer to cover the sidewalls of said recesses;
depositing a second silicon nitride layer to cover said first sidewall oxide layer;
depositing a second sidewall oxide layer over first and second nitride layers such that said narrow recess is filled;
etching said wide recess to clear a gap through said second silicon nitride layer at the bottom of said wide recess;
growing a first field oxide on the area exposed exposed by said gaps;
removing said first and second silicon nitride layers;
depositing a second field oxide layer to fill said narrow recess; and
planarizing said second field oxide to a level approximate to the top edge of said recesses to form isolation regions between said moats.

16. The method of claim 15 and further comprising:
removing said pad oxide layer after said step of planarizing;
growing a gate oxide layer on the exposed portions of said silicon substrate; and
depositing material on said gate oxide layer to be used for transistor gates.

17. The method of claim 15 wherein the remainder of said second sidewall oxide layer is removed prior to growing said first field oxide.

18. The method of claim 15 and further comprising:
forming a layer of polysilicon between said pad oxide layer and said silicon nitride layer.

19. The method of claim 15 wherein said recesses are etched to a depth of about 5,000 Angstroms.

20. The method of claim 15 wherein said second field oxide layer has a thickness of about 10,000 Angstroms.

21. The method of claim 15 wherein said first field oxide layer is grown to a thickness of about 10,000 Angstroms.

22. A method of isolating active regions in a silicon substrate separated by narrow and wide recesses comprising:
filling all recesses with a sidewall oxide;
performing a sidewall etch through said sidewall oxide to expose areas in the wide regions;
growing a first field oxide on said exposed areas of the silicon substrate;
depositing a second field oxide over the remaining substrate to fill the narrow recesses and any remaining unfilled portions of the wide recesses.

23. The method of claim 22 wherein the remainder of said sidewall oxide is removed prior to growing said first field oxide.

24. The method of claim 22 wherein the substrate is covered with a pad oxide layer and a silicon nitride layer prior to filling the recesses with a sidewall oxide.

25. The method of claim 24 wherein a polysilicon layer is formed between said pad oxide layer and said silicon nitride layer.

26. The method of claim 16 wherein the second field oxide is etched to form a planar surface.

27. The method of claim 22 and further comprising:
removing said silicon nitride before depositing said second field oxide;
removing said pad oxide layer after depositing said second field oxide;
forming a gate oxide on the exposed portions of said silicon substrate; and
depositing material on said gate oxide layer to be used for transistor gates.

28. The method of claim 22 and further comprising:
forming a gate oxide layer on the active regions of the silicon substrate; and
depositing material on said gate oxide layer to be used for transistor gates.

29. A semiconductor device whose active regions are separated by isolation regions formed by the process described in claim 1.

30. A semiconductor device having regions separated by isolation regions formed by the process described in claim 6.

31. A semiconductor device having active regions separated by isolation regions formed by the process described in claim 15.

32. A semiconductor device having active regions separated by isolation regions formed by the process described in claim 22.

* * * * *